United States Patent [19]

Catanzaro et al.

[11] Patent Number: 5,733,708
[45] Date of Patent: Mar. 31, 1998

[54] MULTILAYER E-BEAM LITHOGRAPHY ON NONCONDUCTING SUBSTRATES

[75] Inventors: Brian Catanzaro; Adlai H. Smith, both of San Diego, Calif.

[73] Assignee: Litel Instruments, San Diego, Calif.

[21] Appl. No.: 538,153

[22] Filed: Oct. 2, 1995

[51] Int. Cl.$^6$ .................................................. G03F 7/20
[52] U.S. Cl. ........................ 430/296; 430/22; 430/942; 250/492.3
[58] Field of Search ..................... 430/296, 942, 430/313, 22, 5; 250/492.3, 492.2

[56] References Cited

U.S. PATENT DOCUMENTS

| | | | |
|---|---|---|---|
| 4,377,627 | 3/1983 | Vinton | 430/22 |
| 4,816,361 | 3/1989 | Glendinning | 430/5 |
| 4,823,012 | 4/1989 | Kosugi | 250/491.1 |
| 4,895,790 | 1/1990 | Swanson et al. | 430/321 |
| 4,983,864 | 1/1991 | Murai | 250/492.2 |

*Primary Examiner*—Kathleen Duda
*Attorney, Agent, or Firm*—Townsend and Townsend and Crew LLP

[57] ABSTRACT

A technique is described which provides for directly placing multiple patterns on a nonconducting substrate using an electron beam. Prior to patterning, a conductive coating is applied to the nonconductive substrate. The patterns are generated by controlling the position and the speed of movement of the electron beam. Each pattern contains fiducials lying outside of the pattern's active region. After a conductive layer has been exposed, the patterned regions are removed, typically through etching. A separate etch is used to etch the pattern into substrate. The unpatterned portions of the conductive coating are then removed and a new conductive coating is applied to the substrate, insuring that the fiducials are protected during the removal procedure so that they can be used to align subsequent patterns. This procedure is repeated as many times as necessary to form the desired number of patterns in the substrate. This procedure is directly applicable to the generation of computer-generated holograms, specifically diffractive optics. This technique can also be used to generate phase-shifted lithographic mask.

10 Claims, 7 Drawing Sheets

MULTILAYER E-BEAM LITHOGRAPHY ON NONCONDUCTING SUBSTRATES

BACKGROUND OF THE INVENTION

The present invention relates generally to electron beam (e-beam) lithography systems, and more particularly to a method of applying multiple patterns to a nonconducting substrate.

E-beam photolithography is a standard technique for patterning masks as well as for directly patterning substrates. In a conventional technique employing e-beam lithography, a conductive layer or substrate is first patterned with the e-beam. Typically the pattern is generated by manipulating the position of the e-beam with electromagnetic lenses, the lenses under computer control. Once patterned, either a wet etch or a dry etch is generally used to remove the patterned portions of the conductive layer or substrate.

E-beam lithography systems are commonly used in the semiconductor industry, typically to pattern the actual semiconducting material. Silicon and gallium arsenide are examples of such material. These materials are sufficiently conductive to prevent charge build-up during the e-beam process.

The basis of e-beam lithography is the deposition of electrons at very precise locations. If the surface to be patterned is not sufficiently conductive, then the electrons are unable to quickly dissipate. Slow dissipation results in areas of localized charge build-up, leading to the deflection of the e-beam in nearby vicinities. Deflection of the e-beam causes distortion of the desired pattern.

Due to the phenomena of charge build-up and the resultant pattern distortion on nonconducting materials, typically a layer of conducting material must be applied to the nonconducting material prior to exposure to the e-beam. Although the application of a conducting material onto the surface to be patterned prevents charge build-up during single pattern exposures, this solution is inadequate for multiple pattern exposures. After the first pattern has been formed and etched, the substrate is left with only a partial covering of conductive material. If an attempt is made to apply a second pattern to this substrate, even the small areas of exposed nonconducting material will cause localized areas of charge build-up, resulting in pattern distortion.

One technique for avoiding charge build-up on nonconducting surfaces is to move the e-beam at extremely slow rates, thereby giving the electrons more time to dissipate. This technique is more suitable for substrates which are at least partially covered with conducting material, such as substrates which have previously undergone patterning, then substrates which are completely nonconducting. The success of this approach has been rather limited, in part due to the extremely slow patterning rates and the costs associated with these rates, and in part due to this technique's inability to achieve high overlay accuracy.

Another difference with semiconductor processing is that in addition to having to pattern on thick (>1 mm) insulating layers (not conducting, semi-conducting or thin (<1 μm) insulating layers) the overlay accuracy for diffractive optics is generally ½₀th the feature size instead of the ¼ feature size usually associated with semiconductor manufacture. This leads to alignment tolerances of small as 0.02 microns.

From the foregoing, it is apparent that a method of accurately applying multiple patterns to nonconducting substrates is desired.

SUMMARY OF THE INVENTION

The present invention provides a method for directly placing multiple patterns on a nonconducting substrate using e-beam lithography. This method eliminates the steps of preparing an individual mask for each of the desired patterns as well as the steps of optically projecting these individual patterns onto the final nonconducting substrate.

In order to eliminate charge build-up during the e-beam patterning steps, the nonconducting substrate must first be coated with a conductive layer. After coating the conductive layer with e-beam resist, the structure is patterned using an e-beam. The e-beam is capable of forming highly detailed patterns due to its extremely small beam diameter which is well suited for use with a computer controlled beam positioning system. After patterning, the e-beam exposed areas are removed using either a wet or a dry etch. After etching through the conductive layer, a separate etch is used to etch the pattern into the substrate.

In order to form another pattern (i.e., another layer) on the nonconducting substrate the unpatterned portions of the previous conductive coating must first be removed and a new conductive coating applied to the entire substrate. In order to be able to accurately register all subsequent patterns, fiducials are included in each pattern, the fiducials lying outside the pattern's active region. The fiducials and the conductive material immediately surrounding the fiducials are protected during the removal of the unpatterned portions of the previous conductive coating. Electron imaging is used to align and register subsequent masks.

In one embodiment of the invention the fiducial is comprised of an exposed or etched portion of the nonconducting substrate surrounded by conductive material. In another embodiment of the invention, the fiducial is comprised of a fiducial covered by one thickness of conductive material surrounded by an area covered by a second thickness of conductive material, the difference in thickness being sufficient to cause resolvable differences in electron reflectivity. In another embodiment of the invention, the conductive material overlying the fiducial is comprised of a different material than that overlying the area immediately surrounding the fiducial.

A further understanding of the nature and advantages of the present invention may be realized by reference to the remaining portions of the specification and the drawings.

DETAILED DESCRIPTION OF SPECIFIC EMBODIMENTS

In Swanson et al U.S. Pat. No. 4,895,790 issued Jan. 23, 1990, phase masks having more than a binary level are illustrated. The Swanson et al method utilizes high resolution lithography, the alignment of two or more masks, and reactive ion etching. A photoresist layer on an optical element substrate is exposed through a first mask and etched. The process is then repeated for second and subsequent masks to create the multistep configuration.

Figure 1A:
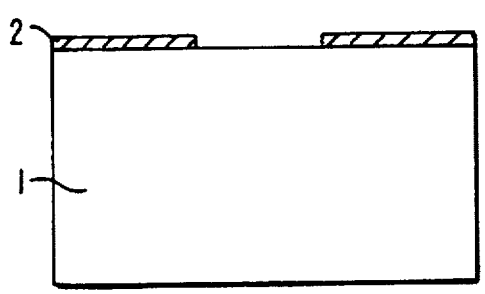
FIGS. 1A-B illustrate the formation of a two level phase mask according to the prior art.
Figure 1B:
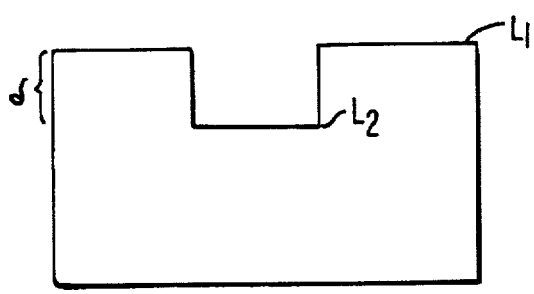

FIGS. 1A-B illustrate the method of producing a two level phase mask according Swanson et al. FIG. 1A is a cross-sectional view of a substrate 1 with a mask 2 applied to the surface to be exposed. Mask 2 is either formed of photoresist or e-beam resist, depending upon whether the pattern is to be formed using photolithographic or e-beam techniques. Mask 2 defines the area which is to be etched. FIG. 1B illustrates substrate 1 after etching. The mask is comprised of two levels, $L_1$ and $L_2$, separated by a distance $\delta$.

Figure 2A:
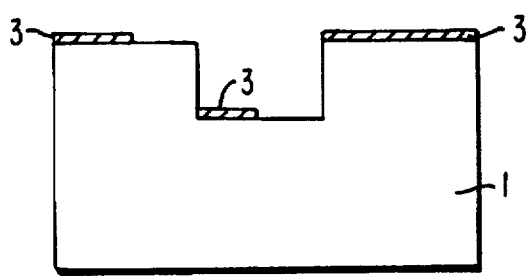
FIGS. 2A-B illustrate the formation of a four level phase mask from the two level phase mask shown in FIG. 1B according to the prior art.
Figure 2B:
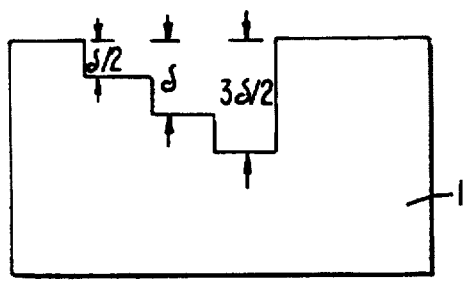

In order to form a four level phase mask from the two level phase mask shown in FIG. 1B, a second mask is applied. Presuming that the photolithography is successful, blocking layers 3 result as illustrated in FIG. 2A. After etching, and assuming that the second etch step etches to a depth of $\delta/2$, the final product is a four level mask as shown in FIG. 2B in which each level is separated by a distance $\delta/2$.

In practice, this method has practical difficulties. First, it requires large scale optical alignment of the second mask to the structure produced by the first mask. Such large scale alignments never are totally accurate.

Second, when you are aligning optically, you are limited as a practical matter by the wave length of light.

Third, debris on or between the contact masks and the plates can produce serious distortions.

We have therefore determined to utilize a technique in which one directly written E-beam layer has another and second E-beam layer directly written over it. This technique—perfected by the disclosure herein—produces at least the following advantages.

First, the reader will understand that we disclose referencing the locations of the second writing to E-beam fiducials left in the first writing. This enables the second E-beam writing to be constantly referenced in its spacing to the first E-beam writing. Great accuracy in the relative placement of the two E-beam writings occurs.

Second, in referencing E-beam locations one to another, we are no longer restricted by the wave length of light. Instead, we can now utilize the accuracy of electrons. This improves the accuracy of the placements.

Third, contact printing and debris is no longer involved.

Although it is desirable to form the multi-level phase mask of FIG. 2B using e-beam lithography due to this technique's high resolution capabilities, it is quite difficult to use this technique in those instances in which substrate 1 is nonconducting.

E-beam lithography is based on the deposition of electrons at precise locations, therefore it is imperative that the substrate be sufficiently conducting to allow charge drainage. Without charge drainage, as the e-beam draws the desired pattern it undergoes distortion and deflection whenever it approaches an area of localized charge build-up. The result of this distortion and deflection is a flawed, low resolution pattern.

There are basically two solutions to the charging problem. In the first solution the nonconducting substrate is coated with a conducting layer, thereby allowing direct e-beam patterning. This technique works quite well with simple two level phase masks, but is generally incapable of forming high resolution phase masks with more than two levels due to inadequacies in the conventional approach. The second solution uses e-beam lithography to form a series of individual "production" masks, the production masks then being used in conjunction with optical photolithography to pattern the nonconducting substrate to form the desired phase mask. This approach is the favored conventional approach for forming multiple patterns or layers on nonconducting substrates. In the second approach the production mask substrates are typically of a nonconducting material and must therefore be coated with a conductive layer to avoid charge build-up during e-beam exposure.

Figure 3:
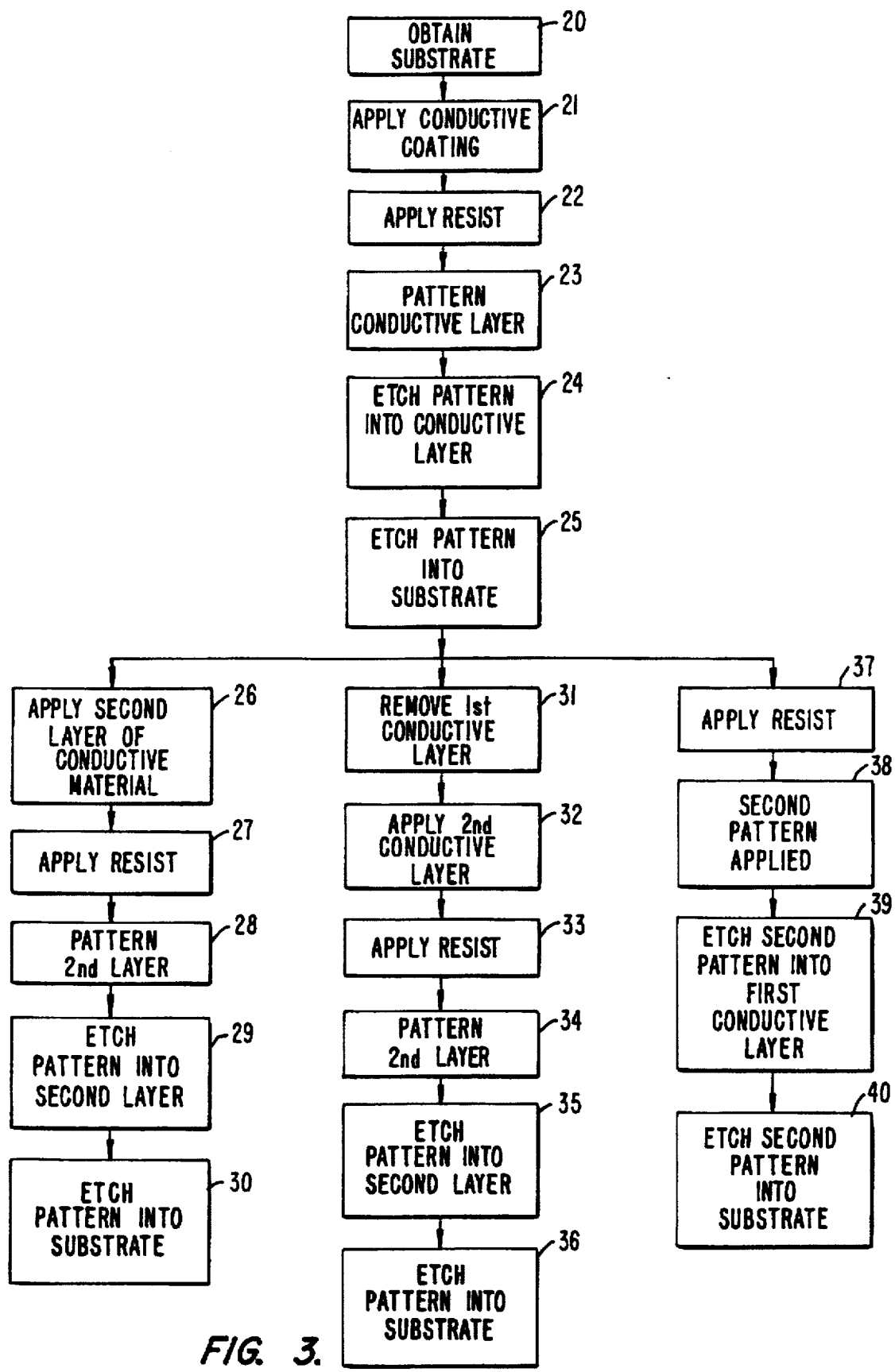
FIG. 3 is a flow diagram representing a technique of forming a multi-level phase mask.

FIG. 3 is a flow diagram illustrating a procedure for forming a four level phase mask directly on the surface of a nonconducting substrate. After obtaining a suitably polished substrate (step 20), a conductive layer is applied to the surface to be patterned (step 21). It is important that the conductive layer is applied uniformly to avoid varying etch rates which may result in undercutting and distortion of the final etched pattern. Furthermore, if the layer is not uniform then the e-beam may be physically displaced during patterning, also causing pattern distortion. The conductivity of the layer is not critical as long as it is sufficiently thick or conductive to insure dissipation of the charge through grounding.

Next the conductive layer is coated with e-beam resist (step 22) and a first pattern is applied using an e-beam (step 23). The e-beam exposed areas are then removed using either a wet or a dry etch (step 24). After etching through the conductive layer, a separate etch is used to etch the first pattern into the substrate (step 25).

Figure 4:
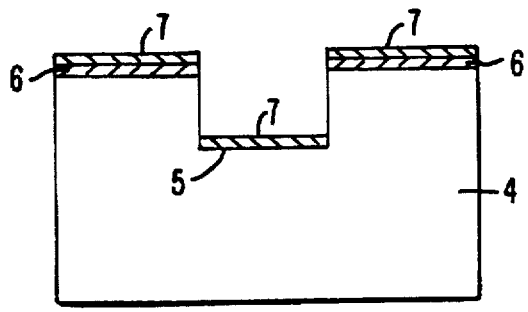
FIG. 4 is an illustration of the cross-section of a two level structure with two conductive layers covering one level and a single conductive layer coating covering the second level.

At this point in the process there are primarily three different methods of applying subsequent patterns to the substrate, each with its own problems. In the first approach (steps 26–30), a new layer of conductive material is applied to the substrate (step 26), the new layer being deposited directly over the first conductive layer. As a result of this step, portions of the substrate are covered with a single conductive layer while other areas are covered with two conductive layers. This phenomena is illustrated in FIG. 4. Substrate 4 shows a single etched step 5 from a previous e-beam lithography process. On either side of step 5 and covering the surface of substrate 4 is a conductive layer 6. On top of step 5 and layer 6 a second conductive layer 7 has been applied. After applying the second conductive layer, an e-beam resist layer is applied (step 27) and the substrate is exposed with the e-beam to form the second pattern (step 28). Next the conductive layer or layers are etched (step 29), followed by the etching of the substrate (step 30).

The problem with this approach occurs during the etching steps and is due to the substrate being covered with conductive material of two different thicknesses, one approximately twice as thick as the other. As a consequence, the etch times for the two different thicknesses also differ by approximately a factor of two. This difference in etch times causes severe undercutting of the nonexposed conductive coatings in some areas, thus limiting the achievable resolution of a pattern formed using this technique.

Figure 5:
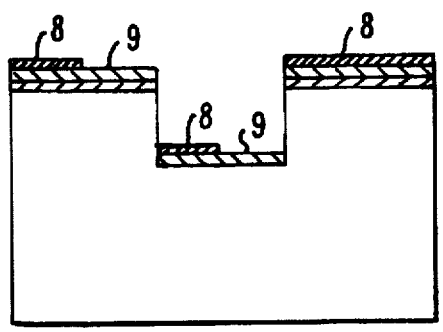
FIG. 5 is an illustration of the structure shown in FIG. 4 coated with resist and patterned in those areas not coated with resist.

The undercutting phenomena is illustrated in FIGS. 5–8. The structure shown in FIG. 5 is the same as that shown in FIG. 4 except for the addition of e-beam resist in areas 8 and e-beam patterning in areas 9.

Figure 6:
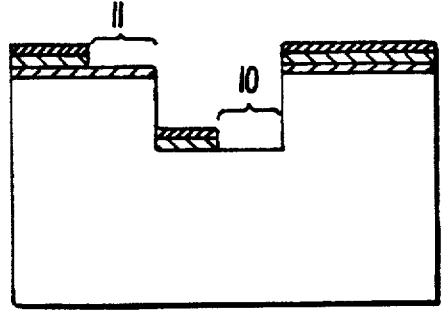
FIG. 6 is an illustration of the structure shown in FIG. 5 after etching for a period of time sufficient to etch away a thickness equivalent to one conductive layer.

FIG. 6 is an illustration of the structure after the conductive coatings have undergone etching for a time x, this time being sufficient to etch away a thickness equivalent to one conductive layer. In portion 10 of the structure, on which there had been a single conductive layer 7, the conductive layer has been completely removed thereby fully exposing the substrate. In portion 11 of the structure, on which there had been two conductive layers, only a single conductive layer has been removed.

Figure 7:
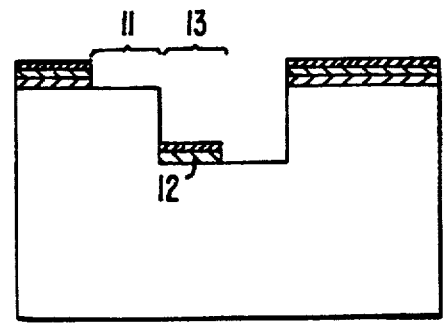
FIG. 7 is an illustration of the structure shown in FIG. 5 after etching for a period of time sufficient to etch away a thickness equivalent to two conductive layers.

FIG. 7 shows the results of increasing the etch time sufficiently to completely remove the conductive layers in portion 11. Due to the increase in etch time, there is severe undercutting along an edge 12 of single coated region 13. As a result of the undercutting, a portion of region 13 will be unintentionally etched, resulting in a distortion of the desired pattern.

Figure 8:
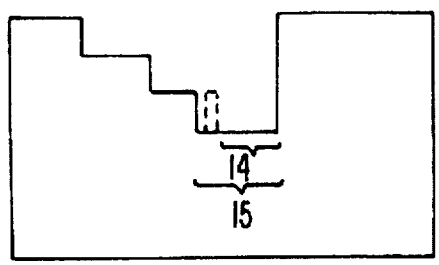
FIG. 8 is an illustration of the structure shown in FIG. 7 after substrate etching.

FIG. 8 is an illustration of the final completed structure. Although a four level mask has been formed, the desired pattern is distorted. The undercutting of the conductive layer during processing has caused an increase in the width of the lowest level from a desired width 14 to an actual width 15. If additional layers of patterning are required the undercutting problem becomes more severe due to increasing variations in conductive coating thickness.

The second method of applying a subsequent pattern to the substrate (steps 31–36) initially requires the removal of the first conductive layer (step 31). Next a second conductive layer is applied to the entire substrate (step 32). After applying a layer of e-beam resist (step 33), the structure is patterned and etched (steps 34–36). Although this method does not suffer from undercutting, registration errors between the first and second patterns prevents this technique from yielding high resolution multilayer patterns.

In the third method of applying a subsequent pattern to the substrate (steps 37–40), no additional conductive layers are applied to the substrate. In this technique, e-beam resist is applied over the previous pattern as well as the remnants of the first conductive layer (step 37). The structure is then patterned and etched (steps 38–40). The problem with this technique arises during the e-beam patterning step since the non-coated portions of the substrate become sites of localized charge build-up. The problem of charge build-up can be lessened through the use of conductive shorts designed into each pattern, the shorts forming conductive bridges across the nonconductive regions. Unfortunately since the shorts must be kept quite small in order to minimize their impact on the performance of the completed phase mask, they provide a very limited reduction in charge build-up. Another technique of avoiding charge build-up across the nonconducting regions is to move the e-beam at an extremely slow rate, with a small exposing current, approximately a tenth to a twentieth of the normal patterning rate for a conductively coated substrate. At this rate much of the charge has time to dissipate, thus minimizing distortion. This approach, however, suffers from two significant problems. First, even at these extremely slow patterning rates, the charge built-up in the larger nonconducting regions does not have sufficient time to dissipate and therefore causes significant distortion. Obviously this problem gets worse as additional patterns are formed due to the increase in nonconducting area. The second problem with this approach is its cost. At the slow rate required by this approach, each individual pattern can take hundreds of hours to complete, thus quickly becoming cost prohibitive.

In the preferred embodiment of the present invention, after the initial conductive layer has been exposed to the e-beam and the first pattern has been etched into the substrate, the remaining portions of the first conductive layer are removed and a new conductive layer is applied. This new layer is then etched and patterned. Fiducials formed on each pattern but lying outside of the pattern's active region are used to accurately register each subsequent pattern to the previous pattern.

Figure 9:
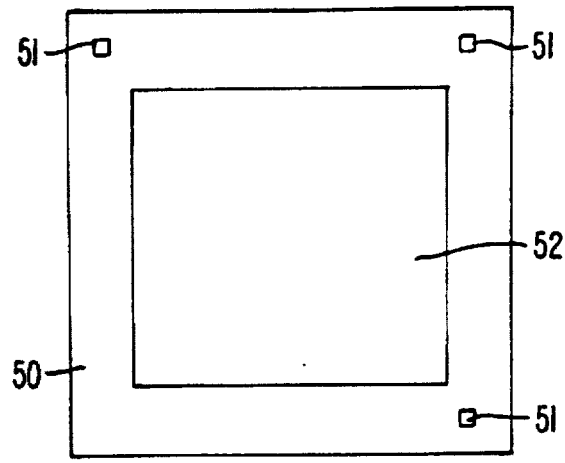
FIG. 9 is an illustration of a substrate with three fiducial markings surrounding the desired pattern region.
Figure 10:
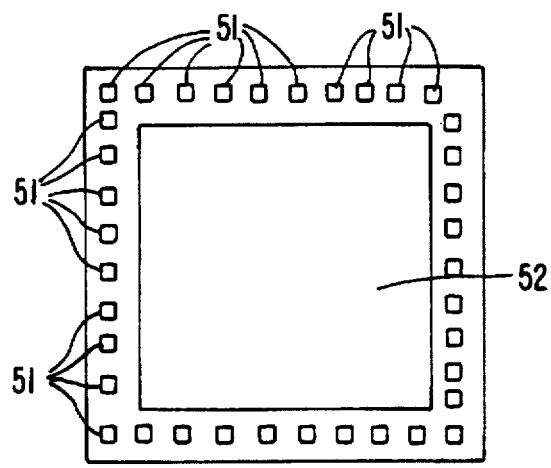
FIG. 10 is an illustration of a substrate with a large number of fiducial markings surrounding the perimeter of the desired pattern region yielding increased pattern registration accuracy.

The preferred embodiment of the present invention includes a method of forming fiducials, protecting the fiducials during processing, and registering subsequent patterns using the fiducials of the previous pattern. FIG. 9 is an illustration of a substrate 50 with a series of fiducial markings 51. In the preferred embodiment three separate fiducials 51 are placed around the perimeter of the desired pattern area 52, the three fiducials providing sufficient information to accurately determine the location of the pattern. For improved pattern registration accuracy, additional fiducials 51 can be provided around the edges of pattern area 52, as illustrated in FIG. 10.

Figure 11:
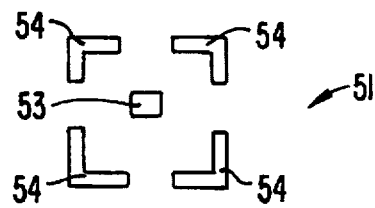
FIG. 11 is an illustration of the preferred fiducial design.

FIG. 11 is an illustration of the preferred design of fiducials 51. In this embodiment, fiducials 51 are comprised of a small dot 53 surrounded by four 'corner' markings 54. Other types of marks such as x's, dots, or rectangles can also be used.

Figure 12:
FIG. 12 is an illustration of the cross-section of a fiducial.

After e-beam exposure, the fiducial markings are etched during the same etch steps as the pattern. FIG. 12 is a cross-sectional view of a fiducial 51. At this stage of processing fiducial 51 has been etched into a substrate 55. Surrounding fiducial 51 is a conductive layer 56.

Typically, e-beam lithography systems are capable of imaging as well as patterning. In the imaging mode electrons are reflected from the surface and imaged using magnetic lenses, normally the same magnetic lenses as are used to manipulate the beam during patterning. This form of imaging offers much higher resolution than is obtainable using optical imaging, therefore yielding much higher pattern registration accuracy than would be obtainable using optical registration. Fiducial 51 does not reflect electrons since it is of nonconducting material. However, since surrounding area 56 is a conductor, this area appears in high contrast to the actual fiducial, thereby resulting in the easy identification of the fiducial's location. Unfortunately, if surrounding conductor 56 is removed during subsequent processing, electron imaging will be unable to distinguish the etched portion 51 of substrate 55 from the unetched portions of the substrate. As a consequence, the conducting material immediately surrounding the fiducials must not be removed during subsequent processing.

Figure 13:
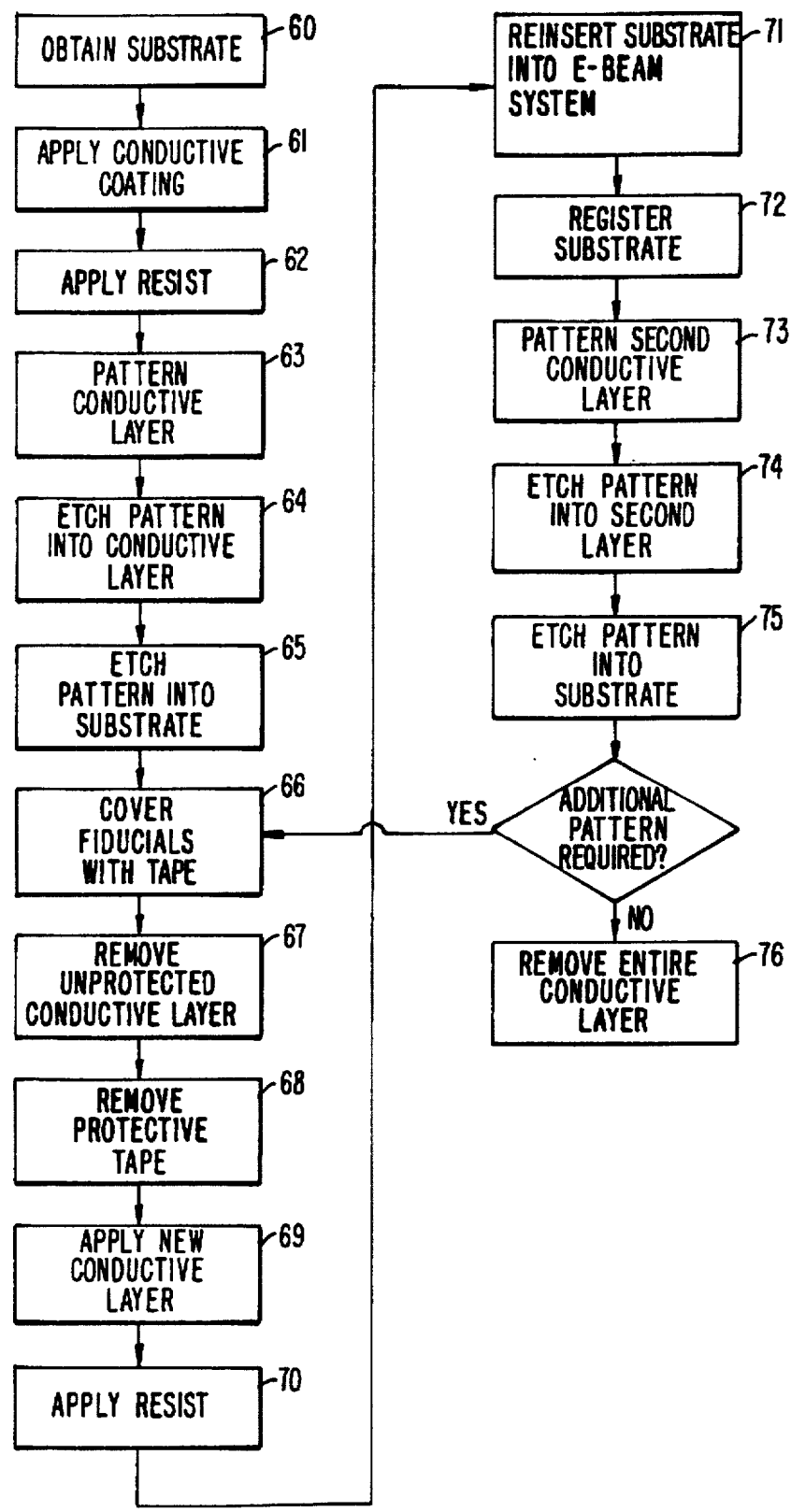
FIG. 13 is a flow diagram of the preferred embodiment of the present invention.

Although there are a number of methods of preventing the removal of surrounding conductive material 56 during processing, the preferred method is the application of removable tape to the selected area. FIG. 13 is a flow diagram of the preferred embodiment of the present invention. Steps 60–65 are identical to the previously discussed steps 20–25 of FIG. 3. The tape is applied after the pattern has been etched into the substrate (step 66). Next the unprotected portions of the conductive coating are removed (step 67) and then the protective tape is removed (step 68). Following the tape's removal a new conductive coating is applied to the substrate (step 69), a new layer of e-beam resist is applied (step 70), the substrate is reinserted into the e-beam system (step 71), and the substrate is registered using the fiducial marks (step 72). After the substrate is registered, it is patterned with the e-beam (step 73), and etched (steps 74–75). At this point if only two patterns are to be applied to the substrate then the entire conductive layer can be removed (step 76). If additional patterns are required, then the process starts over beginning at step 66.

It should be understood that although only tape is explicitly described, other means such as adhesives could be used as well. Additionally, other photolithographic and e-beam lithographic processes could also be used.

Figure 14:
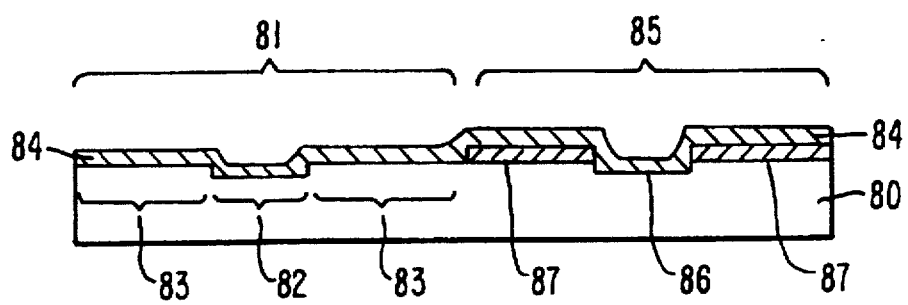
FIG. 14 is a cross-sectional representation of a portion of a nonconducting substrate after the application of a second conductive layer according to the embodiment of the present invention shown in FIG. 13.

FIG. 14 is a cross-sectional representation of a portion of a nonconducting substrate 80 after the completion of step 69. Section 81 is a portion of the substrate which is ready for exposure to the second pattern. A portion 82 of section 81 has been etched during a previous patterning step. Section 81 also contains portions 83 which have not been previously etched. Covering the entire surface of section 81 is a newly deposited conductive layer 84. Section 85 of substrate 80 contains a fiducial marking 86 etched into the surface during the previous patterning step. On either side of fiducial 86 are portions 87 of the previous conductive coating, portions 87 having been protected during the removal of the non-etched portions of the previous conductive coating (steps 66–67). Overlying fiducial 86 as well as first conductive layers 87 is second conductive layer 84.

Although conductive coating 84 overlies all of section 85, due to the differences in electron reflectivity fiducial 86 is still distinguishable from surrounding areas 87 under electron imaging. The areas which are comprised of two layers of conductive material have a detectable difference in reflectivity from those areas which only have one layer of conductive material.

As an alternative to the above technique for protecting fiducial markings, the protective tape can be removed after the application of the new conductive layer. Under this technique no conductive layer would cover fiducial 86. Therefore it would be easily distinguishable on the basis of electron reflectivity from the surrounding conductive material.

Another alternative to the technique outlined in FIGS. 13 and 14 is to use different materials for the individual conductive layers. As discussed above, the material used for the conductive coatings is not critical as long as it is conductive, capable of relatively uniform deposition thicknesses, and has desirable etch properties (i.e., easily etched, uniform etch rates, etc.). Typically the conductive layers are made of metals or metal oxides such as chrome, chrome oxide, gold, and gold oxide. The fiducial markings can be enhanced by using a different material for the first and second conductive layers. For example, layer 87 can be made of gold and layer 84 can be made of chrome.

One application of the present invention is in the formation of computer-generated holograms, particularly for use in diffractive optics. The use of computer generated holograms in combination with a scanning coherent light source to produce a desired image on a substrate is disclosed in U.S. Pat. No. 5,362,940 entitled USE OF FRESNEL ZONE PLATES FOR MATERIAL PROCESSING, which is a Continuation of U.S. Ser. No. 07/612,212 filed Nov. 9, 1990, now abandoned all of which are commonly owned by the assignee herein, Litel Instruments, Inc., and are incorporated herein by reference for all purposes. The above application includes an example of a Fresnel zone plate in which a number of discrete subapertures are used to focus the incident light in order to drill a group of precisely located and dimensioned holes or vias.

Improved techniques of dimensioning and fabricating subapertures, creating amplitude modulation with phase plates, and controlling amplitude with optical features are claimed and described in co-pending Continuation-In-Part application, Ser. No. 08/177,356 filed Jan. 3, 1994, entitled USE OF FRESNEL ZONE PLATES FOR MATERIAL PROCESSING. This application is incorporated in its entirety by reference.

Figure 15:
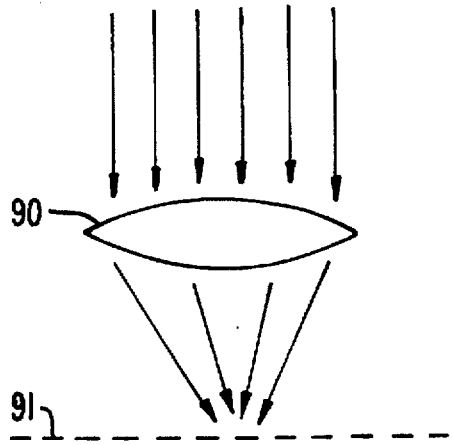
FIG. 15 is an illustration of a simple lens.
Figure 16:
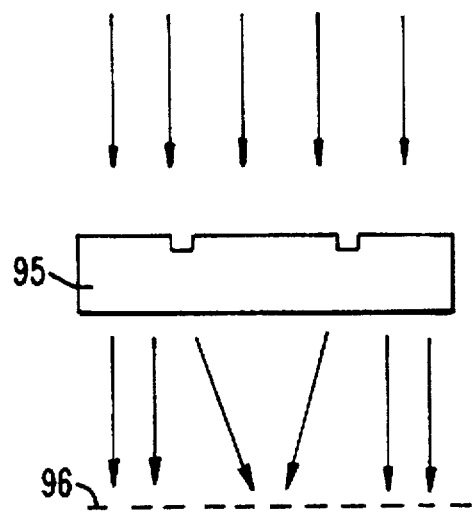
FIG. 16 is an illustration of a two step diffractive optic.

FIGS. 15 and 16 illustrate the differences between refractive and diffractive optics. In FIG. 15, a simple lens 90 is used to focus incident light onto image surface 91. In a refractive optic of this nature, all of the light passing through lens 90 is being focused. As illustrated in FIG. 16, only a small portion of the light incident on a diffractive optic 95 is diffracted and focused onto an image plane 96. The remaining portion of the incident light simply passes through diffractive optic 95. Thus this lens is quite inefficient. One method of improving the efficiency of a diffractive optic is to increase the number of steps which form the optic. For example, as opposed to the two-step diffractive optic shown in FIG. 16, the optic shown in FIG. 17 has a total of four diffractive steps. As the number of steps is increased, more of the light passing through the lens will be focused as opposed to passing uselessly through the lens. The efficiency for a diffractive optic in terms of the number of steps is given by:

$$\text{Efficiency} = \sin c^2(\text{Pi}/2^n)m$$

where n is equal to the number of patterns and $2^n$ is equal to the number of steps. Therefore increasing the number of steps increases the efficiency of the optic. This, however, requires the ability to place a series of patterns onto a single nonconducting substrate, each pattern having a different etch depth.

Figure 17:
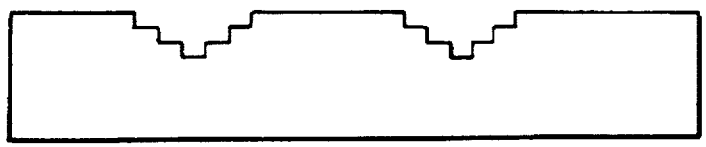
FIG. 17 is an illustration of a four step diffractive optic.

To utilize the present invention to form a four level diffractive optic such as that shown in FIG. 17, basically the procedure outlined in FIG. 13 is followed until a total of two patterns have been applied to the substrate. Typically, each pattern is designed and generated on a computer. The computer is then used to manipulate the e-beam system's magnetic lenses, thereby manipulating the position of the e-beam. Since the electron beam diameter is approximately 80 nanometers, an extremely fine pattern can be achieved.

Since the present invention allows a nonconducting substrate to be directly patterned with as many patterns as desired, the first and most obvious advantage of the present invention is the elimination of numerous processing steps associated with the prior art. The conventional approach of fabricating high resolution phase masks utilizing e-beam lithography was to first fabricate a series of production masks using e-beam techniques, and then use the production masks in conjunction with conventional photolithography to prepare the final phase mask. The present invention eliminates the need for fabricating the individual production masks by allowing multiple patterns to be accurately registered on a single nonconducting substrate.

A second advantage of the present invention is the ability to obtain higher registration tolerances then previously achievable. Since the present invention utilizes electron imaging to align the patterns, smaller registration tolerances are possible than those associated with simple optical registration. Small registration tolerances are critical to achieving high efficiency in an optic. A third advantage of the present invention is the ability to fabricate higher resolution phase masks than was previously achievable using the prior art's multiple mask approach. With the present invention the pattern is formed directly on the nonconducting substrate with the high resolution e-beam. In a conventional approach, although an e-beam is used to pattern the individual masks, the nonconducting substrate is optically exposed to the e-beam prepared masks. Thus two exposure steps are required, thereby decreasing the achievable resolution. Furthermore, due to the wavelengths involved, the optical exposure cannot yield the same resolution as is achievable with the e-beam.

Another embodiment of this invention is useful in cases where the main body of the patterned area (FIG. 10, 52) can accommodate sufficiently small alignment marks. Examples are phase masks for via generation or diffractive optics sufficiently far from an image plane. In this case, alignment marks 51 are still provided on the edges but alignment marks similar to 51 containing small central square 53 is used. These alignment marks are distributed throughout the body, 52, of the patterned area at a density appropriate to the required alignment tolerance. Thus a pattern requiring tight registration might have one or more alignment marks per e-beam exposure field (approximately 3 mm in size). The process of fabricating a plate with alignment marks distributed throughout the body of the pattern is word for word the same as described by FIG. 13 except that step 6t (cover fiducials with tape) is replaced by the following series of steps:

(a) apply negative e-beam resist
(b) align and expose fiducials
(c) develop resist The results of these steps is to cover the alignment marks with a resist barrier that preserves them for alignment. Negative e-beam resist is chosen because of the small area that is required for exposure; positive e-beam resist could equally well be used, resulting exposure time would be longer.

Another variation of steps A, B and C that replace step 66 is:

(a') apply positive photoresist
(b') align a contact mask which has all alignment marks as transparent features
(c') expose and develop Although with the present invention multiple patterns are placed directly on the final substrate, this does not necessarily increase the chances of damaging the substrate and having to start over. In the preferred embodiment after each resist layer has been exposed, the pattern is inspected to insure that it is not flawed. If the pattern does contain a flaw, then the resist layer is simply removed and a new layer is applied for patterning. Similarly, each conducting layer can be inspected after it has been etched. If a conducting layer contains a flaw, the layer can be etched away and a new layer deposited, patterned, and etched. By inspecting both the resist patterns and the conducting layer patterns, the risk of damaging the underlying substrate can be minimized.

Figure 18:
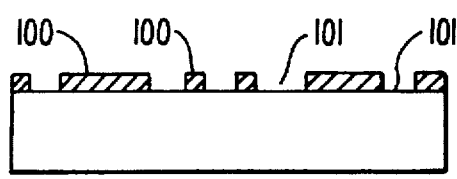
FIG. 18 is an illustration of a representation of a conventional stepper mask.

A second application of the present invention is to form phase-shifted lithography masks. Phase-shifted lithography masks are currently being used in standard steppers in order to produce higher resolution patterns then can be achieved with a standard mask. FIG. 18 shows a cross-sectional view of a representation of a standard stepper mask. This mask is comprised of opaque regions 100 and transparent regions 101. Typically a conventional stepper mask is fabricated by coating a transparent substrate with an opaque material, and then patterning the opaque material through the removal of portions of the material. Using this form of mask, incident light is either blocked or is passed by the mask, the light passing through the mask being imaged by the stepper onto the substrate to be patterned.

Figure 19:
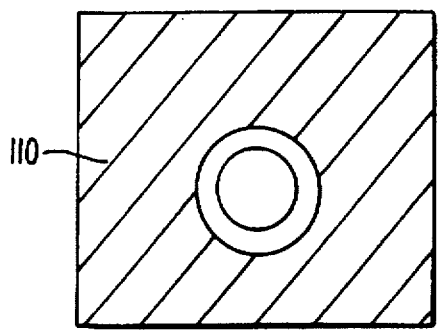
FIG. 19 is an illustration of the top view of a simple phase-shifted lithography mask.
Figure 20:
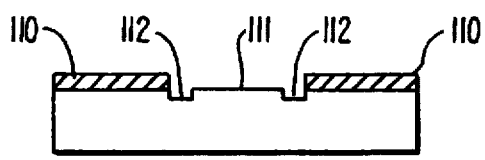
FIG. 20 is an illustration of a cross-sectional view of the simple phase-shifted lithography mask shown in FIG. 19.
Figure 21:
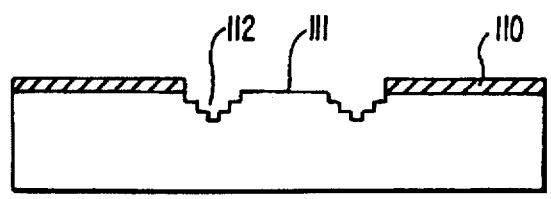
FIG. 21 is an illustration of a cross-sectional view of a phase-shifted lithography mask containing a multi-step diffractive element.

The decreasing feature sizes on integrated circuits have driven a number of changes in the design of steppers. For one, the wavelength in steppers is often lowered in order to fabricate even smaller features. A more recent advance which can be easily retrofitted to a conventional stepper is the use of phase-shifted masks. FIGS. 19 and 20 illustrate two views of a simple phase-shifted lithography mask. Portions 110 are comprised of a conducting layer which is also used as a blocking layer similar to portion 100 in FIG. 18. Portion 111 is a transparent region similar to portion 101 in FIG. 18. Surrounding transparent region 111 is a diffractive element 112. The diffractive or holographic region of the mask improves the achievable resolution of the mask. Thus it is possible to use a conventional stepper and gain extra resolution without having to redesign the system to operate at a lower wavelength. Typically, a phase-shifted lithographic mask can provide between 20 and 40 percent improvement in the resolution over a standard mask. In order to achieve even higher efficiency in the diffractive portion of the mask, a multi-step diffractive element can be used as illustrated in FIG. 21.

Figure 22:
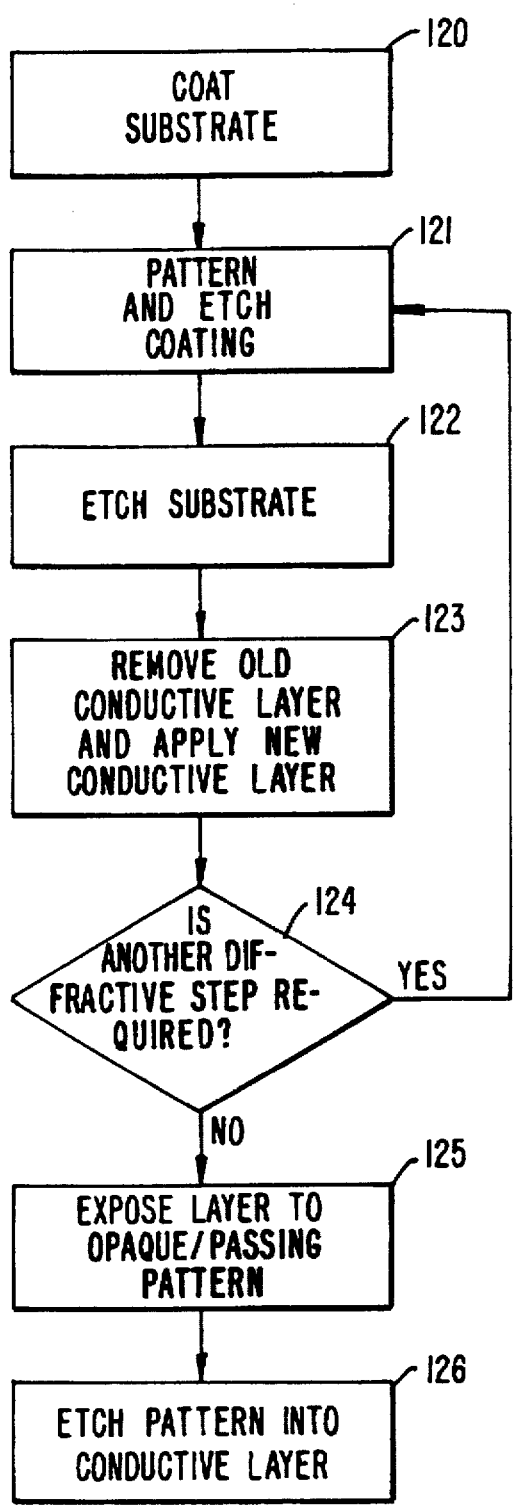
FIG. 22 is a basic flow diagram for fabricating a phase-shifted lithographic mask according to the preferred embodiment of the present invention.

FIG. 22 is a basic flow diagram for fabricating a phase-shifted lithographic mask according to the preferred embodiment of the present invention. The first step is to coat the substrate with a conductive layer (step 120). After coating, the coating is patterned and etched (step 121), followed by etching of the substrate (step 122). The conductive coating is then removed and a new conductive coating is applied to the substrate, insuring that the fiducials are protected during the removal procedure so that they can be used to align subsequent patterns (step 123). Steps 121-123 are repeated as many times as are necessary to form the desired number of steps in the diffractive elements of the mask (step 124). After all of the steps have been etched into the substrate, the last conductive layer is exposed to the last pattern, this pattern containing the blocking information (step 125). This final pattern is etched into the conductive coating (step 126), however the underlying substrate is not etched nor is the non-patterned portions of the conductive coating removed.

Another application of this fabrication technique relates to the fabrication of diffractive optics as applied to imaging systems. It is generally known that due to the versatility of form that diffractive optics can assume that they are useful in simplifying and reducing the number of elements in optical system. The methods of this invention can be used to manufacture fine featured, multi-element diffractive optics used as standard elements. Yet another application of this invention is to the fabrication of correction elements in imaging systems, specifically "steppers". U.S. Pat. No. 5,392,119 issued Feb. 21, 1995, "Plate Correction of Imaging Systems", assigned to Litel Instruments, describes plates correcting individual stepper aberrations with the consequence of improving distortion and field curvature. We claim the use of this fabrication technique in manufacturing the places described in this disclosure.

As will be understood by those familiar with the art, the present invention may be embodied in other specific forms without departing from the spirit or central characteristics thereof. For example, the conducting layer may consist of any of a myriad of different conducting materials, the material need not be a metal or a metal oxide. Furthermore, the number of steps in the completed mask is simply dependent upon the efficiency desired, not upon a limitation of the invention. Accordingly, disclosure of the preferred embodiment of the invention is intended to be illustrative, but not limiting, of the scope of the invention, which is set forth in the following claims.

What is claimed is:

1. A method of producing multiple patterns on a non-conductive substrate to form a patterned substrate, comprising:

patterning a surface of the non-conductive substrate with an e-beam, including affixing a first conductive layer of e-beam resist to the surface and patterning with an e-beam to produce a first patterned conductive layer defining patterned areas between the first patterned conductive layer;

providing at least one fiduciary mark with the first patterned conductive layer;

removing a portion of the non-conductive substrate from the patterned areas of the patterned substrate to form a first pattern on the non-conductive substrate;

protecting the fiduciary mark to produce a protected portion over the fiduciary mark;

removing the first conductive layer, wherein the fiduciary mark of the first conductive layer is protected from removal;

detaching the protected portion from the first conductive layer to expose the fiduciary mark;

affixing a second conductive layer to the first pattern on the non-conductive substrate;

registering the non-conductive substrate for patterning utilizing the fiduciary mark;

patterning the surface of the non-conductive substrate with an e-beam, including affixing a second conductive layer of e-beam resist to the surface and patterning with the e-beam to produce a second patterned conductive layer defining second patterned areas between the second patterned conductive layer;

removing a second portion of the non-conductive substrate from the second patterned areas of the patterned substrate; and removing the second conductive layer.

2. The method of claim 1, wherein the protected portion of the first conductive layer includes a piece of tape applied to an area of the first conductive layer surrounding and including the fiduciary mark.

3. The method of claim 1, wherein the e-beam is controlled by a computer.

4. The method of claim 1, wherein at least three fiduciary marks are provided on the non-conductive substrate, the fiduciary marks lying outside the first patterned conductive area.

5. The method of claim 1, wherein the first conductive layer is formed of a first material and the second conductive layer is formed of a second material.

6. The method of claim 5, wherein the first material and the second material have the same composition.

7. The method of claim 1, wherein the first conductive layer and the second conductive layer are selected from the group consisting of metals and metal oxides.

8. The method of claim 1, wherein at least one of the removing steps uses an etching technique.

9. The method of claim 1, further comprising the steps of:

determining if the first patterned conductive layer meets a predetermined quality level prior to removing the portion of the non-conductive substrate from the patterned areas of the patterned substrate, and, if the first patterned conductive layer does not meet the predetermined quality level, then;

removing the first patterned conductive layer;

patterning a surface of the non-conductive substrate with an e-beam, including affixing a third conductive layer of e-beam resist to the surface and patterning with an e-beam to produce a third patterned conductive layer defining patterned areas between the third patterned conductive layer; and, removing the third conductive layer from the patterned areas of the patterned conductive layer.

10. The method of claim 9, further comprising the steps of:

determining if the patterned second conductive layer meets a predetermined quality level prior to removing the second portion of the non-conductive substrate from the second patterned areas of the patterned substrate, and, if the patterned second conductive layer does not meet the predetermined quality level, then;

removing the second conductive layer;

patterning a surface of the non-conductive substrate with an e-beam, including affixing a fourth conductive layer of e-beam resist to the surface and patterning with an e-beam to produce a fourth patterned conductive layer defining patterned areas between the fourth patterned conductive layer; and, removing the fourth conductive layer from the patterned areas.

* * * * *